Aug. 4, 1970 J. J. STEINMETZ, JR., ET AL 3,523,215

STACK MODULE FOR FLAT PACKAGE SEMICONDUCTOR DEVICE ASSEMBLIES

Filed March 19, 1968 4 Sheets-Sheet 1

WITNESSES

Theodore F. Wrobel

Donald M. Winegar

INVENTORS
John J. Steinmetz Jr., Herbert E. Ferree
and Thomas P. Nowalk

BY

C. L. Menzemer

ATTORNEY

Aug. 4, 1970 J. J. STEINMETZ, JR., ET AL 3,523,215

STACK MODULE FOR FLAT PACKAGE SEMICONDUCTOR DEVICE ASSEMBLIES

Filed March 19, 1968 4 Sheets-Sheet 2

STACK MODULE FOR FLAT PACKAGE SEMICONDUCTOR DEVICE ASSEMBLIES

Filed March 19, 1968

3,523,215

STACK MODULE FOR FLAT PACKAGE SEMICONDUCTOR DEVICE ASSEMBLIES

John J. Steinmetz, Jr., Monroeville, and Herbert E. Ferree and Thomas P. Nowalk, Greensburg, Pa., assignors to Westinghouse Electric Corporation, Pittsburgh, Pa., a corporation of Pennsylvania Filed Mar. 19, 1968, Ser. No. 714,196
Int. Cl. H01l *1/12*
U.S. Cl. 317—100 17 Claims

ABSTRACT OF THE DISCLOSURE

A stack module for flat packaged semiconductor devices comprises side panels which function as tension members to retain the electrical components of the stack in a good electrically conductive relationship with each other as well as providing a means for mounting necessary electrical circuits thereon and a means for channeling the coolant medium through one or more of these stacks.

BACKGROUND OF THE INVENTION

Field of the invention

This invention relates to stack modules comprising two or more flat package semiconductor devices.

Description of the prior art

Heretofore, stack modules embodying flat package seimconductor devices made to date entailed an end use which enabled one to achieve satisfactory operation under conditions of free or moderate forced air convection. However, as the power rating of the stack modules increase, it becomes essential to cool the semiconductor devices with a forced flow of a cooling medium channeled about the semiconductor devices and associated heat sink members.

SUMMARY OF THE INVENTION

In accordance with the teachings of this invention there is provided a stacking module comprising two end plates; two side members, the members maintaining the opposed end plates apart from each other, the members and the end plates forming an enclosed passageway; a plurality of flat package electrical devices disposed within the enclosed passageway; at least one thermally and electrically conductive member disposed between each end plate and an electrical device and between each pair of adjacent electrical devices; at least two electrodes, one of the electrodes being disposed between one end plate and the adjacent thermally and electrically conductive member, another of the electrodes being disposed between the other end plate and the adjacent thermally and electrically conductive member one end of each of the electrodes passing through and extending beyond one side member; means for axially aligning the electrical devices, the thermally and electrically conductive members, and the electrodes within the module; a centrally disposed readily adjustable force means disposed in at least one of the opposed end plates and acting directly on the electrical devices, the thermally and electrically conductive members, and the electrodes forcing the devices, the members, and the electrodes into a thermal and electrical conductive relationship with each other, whereby a pressure electrical contact is established therebetween; at least one terminal board contiguous with one side member, the terminal board having an electrical circuit disposed thereon and electrically connected to at least one of the plurality of electrical devices; and means for cooling the electrical devices and the thermally and electrically conductive members of the module.

An object of this invention is to provide a stacking module comprising solid side members which act as tensile members for the stacking module.

Another object of this invention is to provide a stacking module wherein all required electrical circuits for each electrical device of said module is mounted on the outside of solid side members of the module.

Another object of this invention is to provide a stacking module wherein at least one pressure electrical contact means is employed to electrically connect the electrical devices comprising the module into an electrical circuit external to the module.

A further object of this invention is to provide a stacking module wherein at least one centrally disposed, readily adjustable force means acts directly on the electrical devices, the thermally and electrically conductive members, and the electrodes forcing the members, the devices and the electrodes into a thermal and electrical conductive relationship with each other, the force means being at approximately the same electrical potential as the nearest electrical device.

A still further object of this invention is to provide a stacking module comprising a means for accurately aligning the components thereof, the means comprising a thermally and electrically conductive member having at least one major surface having a centrally disposed upwardly extending pedestal portion having a closed depression formed in the major surface about the outer periphery of the pedestal portion, the depression having a substantially vertical outer peripheral wall and an upwardly inclined inner peripheral wall forming at least a portion of the outer peripheral surface of the pedestal.

Other objects of this invention will, in part, be obvious and will, in part, appear hereinafter.

DRAWINGS

In order to more fully understand the nature and objects of this invention, reference should be had to the following drawings, in which.

Figure 1A:
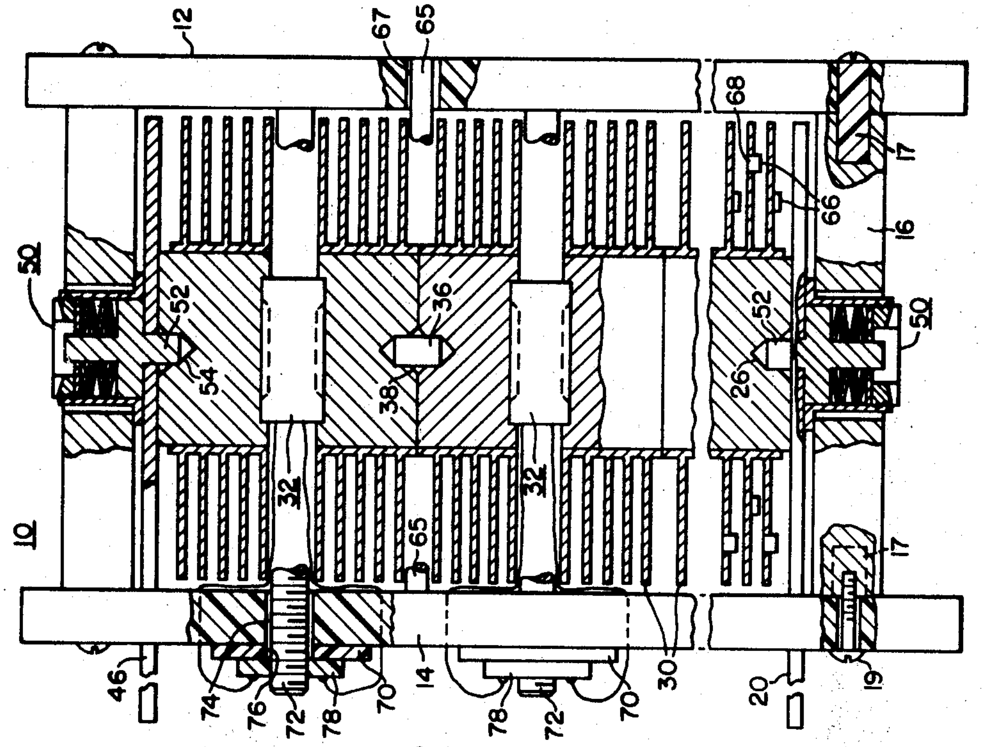
FIGS. 1 and 1A are elevation views, partly in cross-section, of a stacking module made in accordance with the teachings of this invention.
Figure 1:
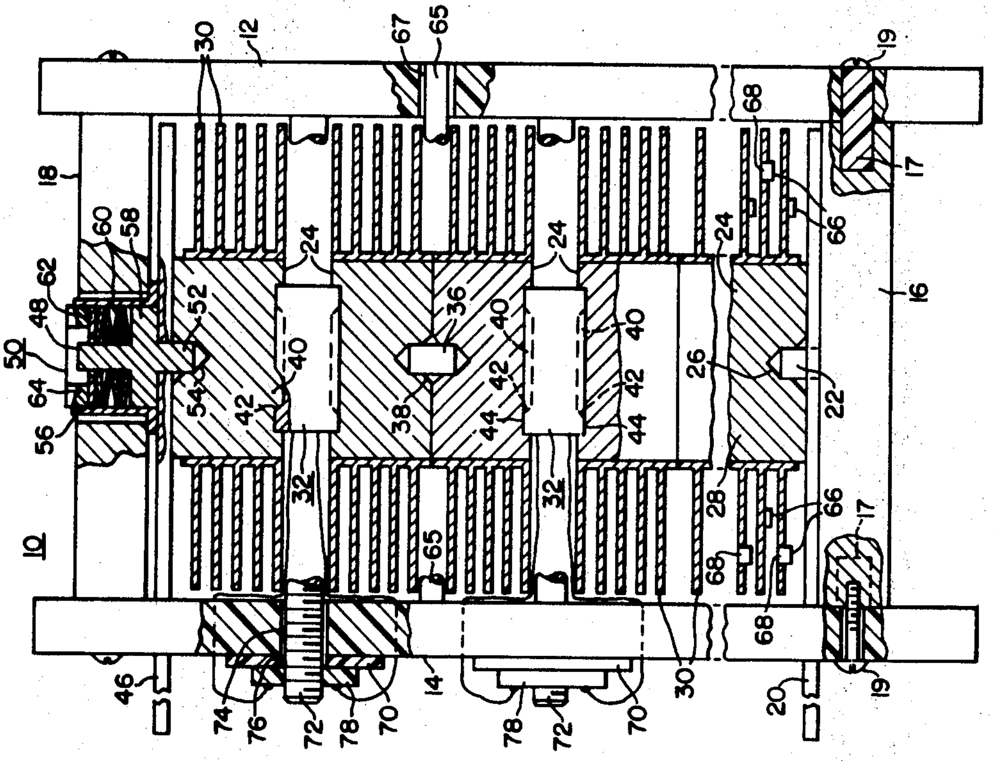

With reference to FIG. 1, there is shown a stacking module 10 comprising flat package semiconductor devices, the module 10 being constructed in accordance with the teachings of this invention.

The module 10 comprises two side, or tensile, members 12 and 14. The members 12 and 14 comprise an electrically insulating material such for example as laminated fiber glass and paper materials impregnated with a melamine, a phenolic or an epoxy material. One particularly suitable material for this application is a phenolic laminate fabricated from beech wood veneers. This particular material has superior mechanical properties, good insulating characteristics, good machining properties, and good esthetic qualities exhibited by its pleasing wood grain appearance.

End plates 16 and 18 are employed to join the members 12 and 14 together. The end plates 16 and 18 may be made of any suitable material having sufficient strength to support the components therebetween. In some instances the end plate 16 and 18 comprise the same material as the side members 12 and 14. In other instances the plates 16 and 18 may comprise a suitable metal. Preferably, the metal should be electrically conductive such, for example, as copper, brass, aluminum, and steel. The end plates 16 and 18 are suitably joined to the members 12 and 14 by any method known in the art. Preferably, however, the joining is accomplished by inserting bearing members 17 through the side members 12 and 14 and partway into each of the end plates 16 and 18. The bearing members are employed as load bearing members to transmit force from the plates 16 and 18 to side members 12 and 14. Screws 19 are also employed as a means to keep the side members 12 and 14 from separating from the plates 16 and 18. An adhesive, such, for example as an epoxy resin, may also be employed to accomplish the joining together of the components. Although the ends of the members 12 and 14 may be flush with the outside surface of the respective plates 16 and 18 they preferably extend beyond them as shown in FIG. 1.

A first electrode 20 is disposed on the plate 16. The electrode 20 comprises a suitably electrically conductive material such for example as copper, brass, silver and aluminum. The electrode 20 is centered within the module 10 by a locating pin 22 which is preferably affixed to the plate 16 and passes through an aperture in the electrode 20.

A plurality of heat sink members 24 is disposed within the module 10. The bottom one of the heat sink members 24 is disposed on the electrode 20 and centrally aligned within the module 10 by the end of the pin 22 protruding into a recess 26 of the bottom member 24. Each member 24 comprises a central core 28 and a plurality of fin members 30 which are attached to, or integral with, the core 28. The material comprising each heat sink member 24 is both electrically and thermally conductive.

Disposed between selective heat sink members 24 are flat package semiconductor devices 32. In instances where the heat generated is high it may be necessary to employ a large heat sink member 24 or two heat sink members 24 nested together. In all instances the members 24 and the devices 32 are axially aligned within the module 10 by locating pins 36 inserted in location holes 38 of the members 24, axially disposed pedestals 40 in the heat sink members 24, and axially disposed depressions 42 in the devices 32.

Preferably axial alignment of the components and better axial force loading of the components is achieved by forming a groove 44 about the outer periphery of the pedestal 40 of each member 24 in contact with a device 32. The outer peripheral wall of the groove 44 is perpendicular and accurately machined to prevent lateral movement of the device 32 nested therein. The inner wall of the groove 44 is preferably slanted, the groove 44 being wider at the top than the bottom.

A second electrode 46, passes through the side member 14 and is disposed on the top most heat sink member 24. A pin 48 which is part of the resilient force assembly 50 axially mounted in the end plate 18 locates the electrode 46 on the member 24 by a protruding end 52 which passes through an aperture of the electrode 46 and into an axially located hole 54 of the member 24. The electrode 46 is electrically conductive and comprises any of the same materials as the electrode 20.

The resilient force assembly 50 applies the necessary force to the components of the module 10 to maintain them in both a good electrically and a thermally conductive relationship with each other. The assembly 50 comprises a sleeve 56, the upper internal wall of which is threaded. The pin 48 is disposed within the sleeve 56 and has an integral peripheral shoulder 58 located between the ends of the pin 48. The bottom surface of the shoulder 58 rests on the electrode 46. One, or more, apertured spring washer 60 is disposed within the sleeve 56 and on the upper surface of the shoulder 58. An apertured flat washer 62 may be disposed on the uppermost spring washer 60. An externally threaded nut 64 engaging the threaded portion of the sleeve 56 is employed for retaining the components of the assembly 50 together and as a means for adjusting and maintaining the force developed by the spring washer(s) 60 necessary to retain the good electrically and thermally conductive relationship between the components of the module 10.

When the thermal energy of the components of the module 10 make thermal expansion of the components sufficient for serious consideration, a second resilient force assembly 50 replaces the locating pin 22 as shown in FIG. 1A.

Preferably the pin 48 of the assembly 50 comprises an electrically conductive metal in order that the assembly 50 may be at the same electrical potential as the nearest semiconductor device 32 thereby maintaining the assembly 50 at approximately the same electrical potential as the electrode 46. This arrangement reduces the susceptability of the module 10 to create an electrostatic discharge from occurring between the resilient force assembly 50 and the nearest semiconductor device 32.

In operation it has been discovered that the electrodes 20 and 46 need not be physically attached to the adjacent heat sink members 24 in order to achieve a good electrically conductive relationship between them. It is sufficient that the electrical contact be a pressure electrical contact.

In operation a coolant medium is caused to flow in and about the components of the module. The most effective cooling is really accomplished by the coolant medium which comes into contact with the fins 30. The bypass coolant medium which is the coolant which circulates between the ends of the fins 30 and the internal walls of the members 12 and 14 as well as that which passes through the gaps between adjacent components comprising heat sink members 24 and for semiconductor devices 32 accomplishes insignificant cooling of the module 10. Therefore, a means is employed to restrict the flow of this bypass coolant and to create turbulence within the coolant stream as well in order to obtain a better heat transfer relationship between the components of the module 10 and the coolant medium.

One means of creating turbulence in the coolant medium flow is to place a plurality of baffle rods 65 across the width of the module, preferably at least one rod 65 across each gap occurring between adjacent pairs of heat sink members 24 or at least one rod 65 disposed across a semiconductor device 32 sandwiched between two heat sink members 24 as shown in FIG. 1. The baffle rods 65 each preferably comprise an electrically insulating material, the material being the same as, or similar to, the material comprising the members 12 and 14. Additionally, insulating sleeves (not shown) may be disposed enclosing the baffle rods 65 to block, or restrict, additional coolant flow where desired.

One method of assembling the rods 65 into the module 10 is to threadedly engage one end of each rod 65 into one, or the other, of the side members 12 and 14. The other end of each rod 65 is inserted into a clearance hole 67 in the other side member.

Another means of creating a turbulent coolant medium flow is to supply each of the cooling fins 30 with a plurality of integral spoilers 66 formed by punching an aperture 68 in each fin and folding the metal displaced to form the spoiler 66. The flow pattern of the coolant is disturbed by reason of having to flow around the obstacle in its otherwise open path and turbulence is accomplished thereby reducing the stagnant film layer thickness.

The semiconductor devices 32 may be electrically connected together in a series electrical circuit, a parallel electrical circuit, or a series-parallel electrical circuit. Where a parallel electrical circuit is employed, the adjacent semiconductor devices and the components of the adjacent electrical circuits must be physically electrically insulated from each other. This is readily achieved by introducing an insulating washer comprising, for example, mica, or a phenolic laminate, between adjacent back-to-back heat sink members 24. In the instance of a parallel, or a series-parallel electric circuit arrangement, it is necessary to introduce additional electrical electrodes equivalent to electrodes 20 and 46 for the additional required internal electrical connections. Additionally, the locating pin 36 between adjacent paralleled semiconductor devices 32 must also be of an electrically insulating material in order to prevent an electrical short circuit from occurring between them.

Figure 2:
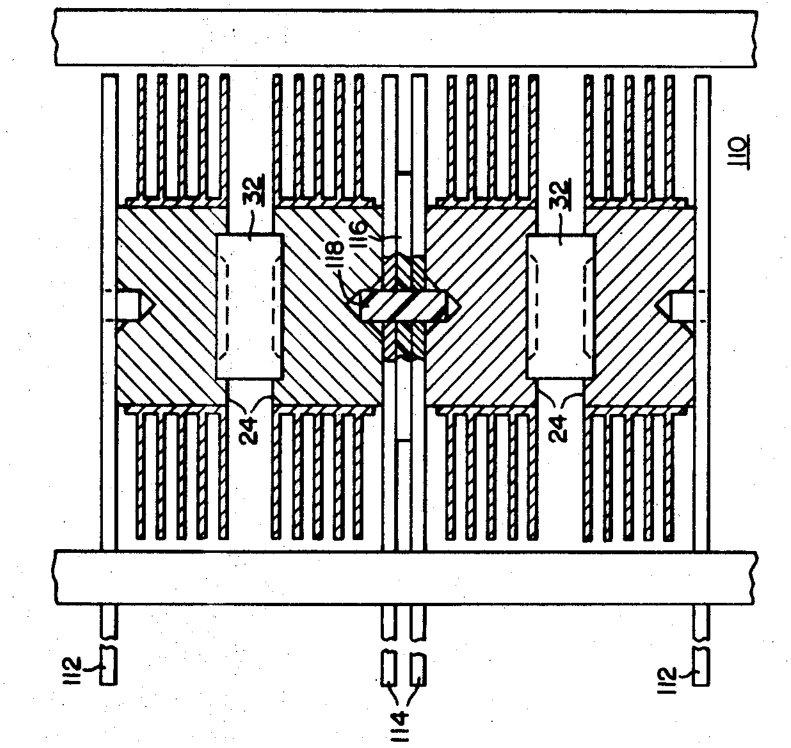

Referring now to FIG. 2, there is shown a portion of a stacking module 110, which is a modification of the module 10, wherein two adjacent semiconductor devices 32 are connected in a parallel electrical circuit. Each of the devices 32 is disposed between and axially oriented by a pair of aforementioned heat sink members 24. Each of the devices 32 and their associated heat sink members 24 are disposed between a pair of electrodes 112 and 114, which are electrical and mechanical equivalents of the electrodes 20 and 46. An electrical insulating washer 116 comprising a suitable material having sufficient compressive strength to resist crushing is disposed between the electrodes 114 of each of the parallel devices 32. A locating pin 118 comprising an electrical insulating material extends through the washer 116 and each of the electrodes 114 and into the adjacent heat sink member 24 of each device 32 and completes the electrical isolation between the paralleled devices 32.

Figure 3:
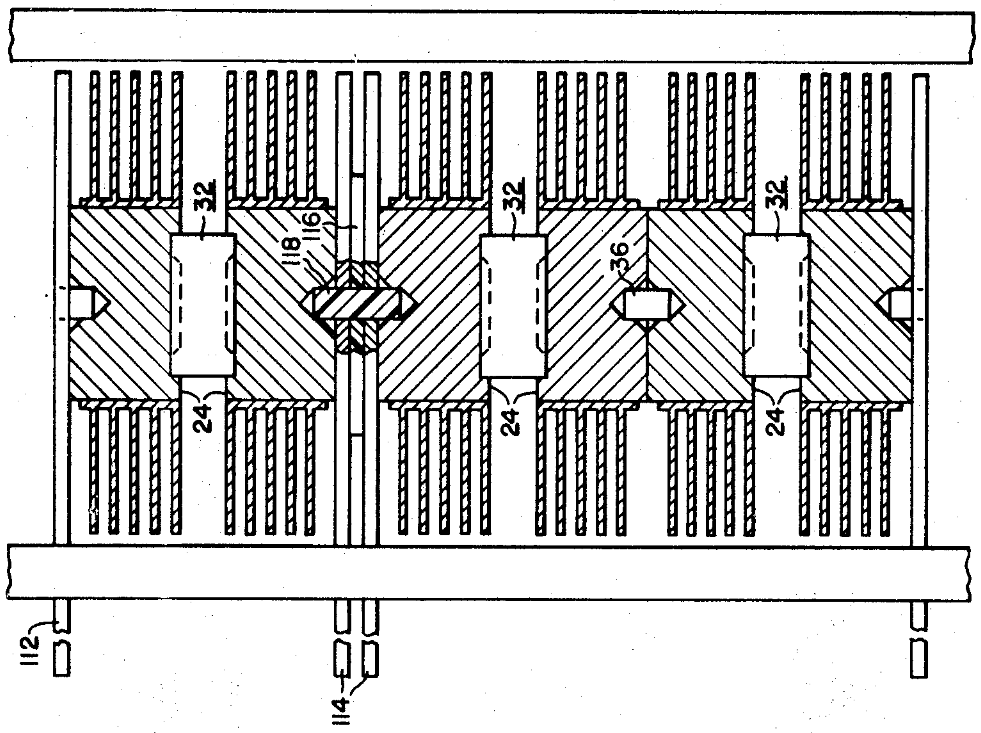
FIGS. 2 and 3 are elevation views, partly in cross-section of portions of stacking modules made in accordance with the teachings of this invention.

With reference to FIG. 3 there is shown a portion of a stacking module 150, which is a modification of the module 10, wherein two semiconductor devices 32 are electrically connected together in a series electrical circuit and the same two devices 32 are in turn electrically connected in a parallel-electrical circuit with a third semiconductor device 32. The arrangement of the module 150 is the same as the module 110 except that an additional device 32 and its two associated heat sink members 24 are disposed between the lower electrode 112 and the lower heat sink member 24 of the original device 32.

The necessary electronic components and circuitry for the module is conveniently mounted on a terminal board 70 affixed to the outside of one of the side members 12 or 14. In FIG. 1 it is shown as being mounted on the member 14. One means of mounting the terminal board 70 on the member 14 is to employ a plurality of tie rods 72 which are threaded into the member 12 and pass through a hole 74 in the member 14 and a hole 76 in the terminal board 70. A nut, preferably a jam nut, 78 threadedly engages the end of each of the tie rods 72 to secure the terminal board 70 to the member 14. The tie rods 72 comprise the same material and perform the same functions as the baffle rods 65.

All electrical connections to each semiconductor device 32 where applicable is achieved through the terminal boards 70 via electrical leads passing through holes in the members 12 and 14 and conceivably even the board 70 itself. Similarly electrical connections between adjacent semiconductor devices 32 are wired via the respective terminal boards 70. One particular use of the terminal board 70 is to mount the shunting components or balancing network circuit. A second use is that of providing an electrical connection to the gate contact when the semiconductor device 32 is a thyristor, or for the purpose of mounting the entire gate firing network.

The board 70 is also suitable to mount the various shunting and gating circuitry directly on either of the side members 12 or 14. In this instance the terminal board is integral with the side member 12 or 14 and reduces the number of pieces of hardware required to assemble the module 10.

Figure 4:
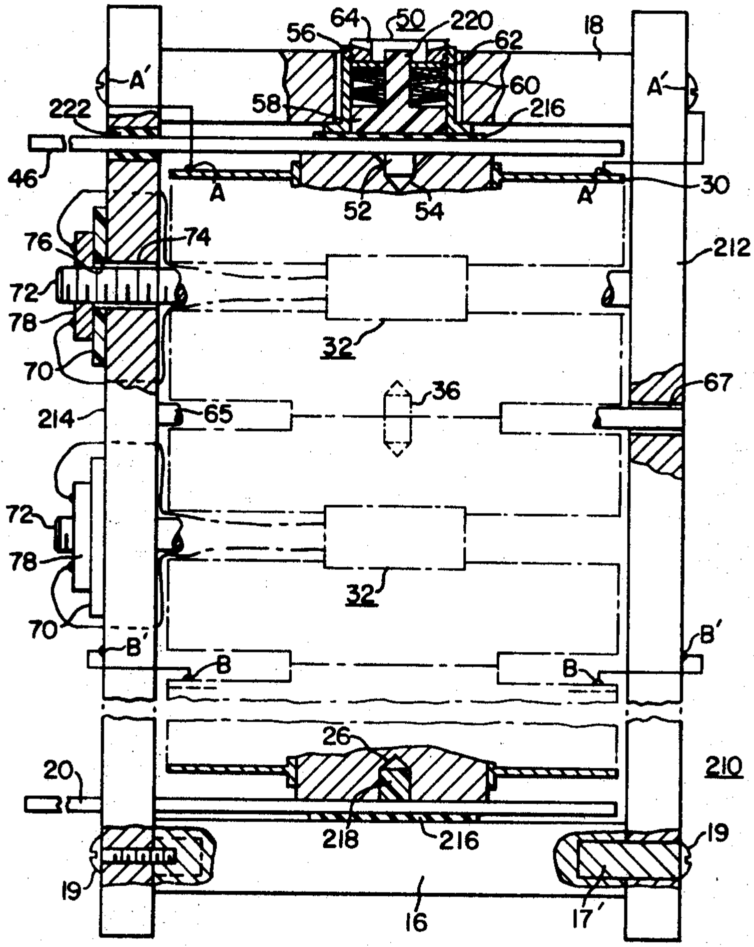
FIG. 4 is an elevation view, partly in cross-section of a stacking module made in accordance with the teachings of this invention.

With reference to FIG. 4 there is shown an alternate construction of the stacking module 10 which produces a stacking module 210 comprising two metallic side members 212 and 214. The members 212 and 214 comprise such suitable materials as steel, stainless steel, aluminum or any other metal providing that the material has enough strength to resist elongations under standard loading of the module 10. The module 210 comprises a plurality of of semiconductor devices 32 and heat sink members 24. The electrical potential diffeernce between the ends 16 and 18 is enough to cause a floating electrical potential to occur in the side members 212 and 214. Therefore it is necessary that the plurality of devices 32 and their heat sink members 24 must be electrically insulated from the ends 16 and 18 and the side members 212 and 214 electrically connected to one of the devices 32. This procedure minimizes the floating electrical potential of the members 212 and 214 by establishing their electrical potential at approximately that of the device 32 to which it is attached.

To electrically isolate the ends 16 and 18 from the devices 32 and heat sink members 24, an insulating washer 216, comprising an electrically insulating material of sufficient compressive stregnth to resist crushing, is disposed between the electrode 20 and the end member 16 and the electrode 46 and the sleeve 56 projecting beneath the end member 18. Additionally, for electrical isolation the locating pin 22 of the module 10 is replaced by a locating pin 218 comprising an electrical insulating material of suitable strength. Completing the electrical isolation, the pin 48 of the module 10 is replaced by a pin 220 comprising an electrical insulating material of suitable strength to resist crushing. If the electrical potential of the module 210 is low it may be only necessary to electrically connect the members 212 and 214 at connection A′ to the connection A of the heat sink member 24 which has the same approximate potential as the last device 32 in the module 210. If the module 210 generates a higher electrical potential it is desirable that the electrical connection be made from the center device of the stack, or between connection B′ of the members 212 and 214 and the connection B of the heat sink member 24 of the center device 32.

To prevent an accidental short circuit from occurring between electrodes 20 and 46 and the member 214 through which they project, an electrically insulating sleeve 222 is disposed about each of the electrodes 20 and 46.

It is often desirable to have the members 212 and 214 at some known potential. Therefore, when the stacking module 210 comprises two devices 32, one may eliminate the use of one of the insulating washers 216. The members 212 and 214 are then at approximately the same potential as the device 32 not insulated from the end plate. It then does not become necessary to employ the electrical connection AA′. However, one may also employ both washers 216 and the connection AA′. When the module 210 employs three or more devices 32, the connection BB′ is preferably employed in addition to both washers 216.

Figures 5, 6:
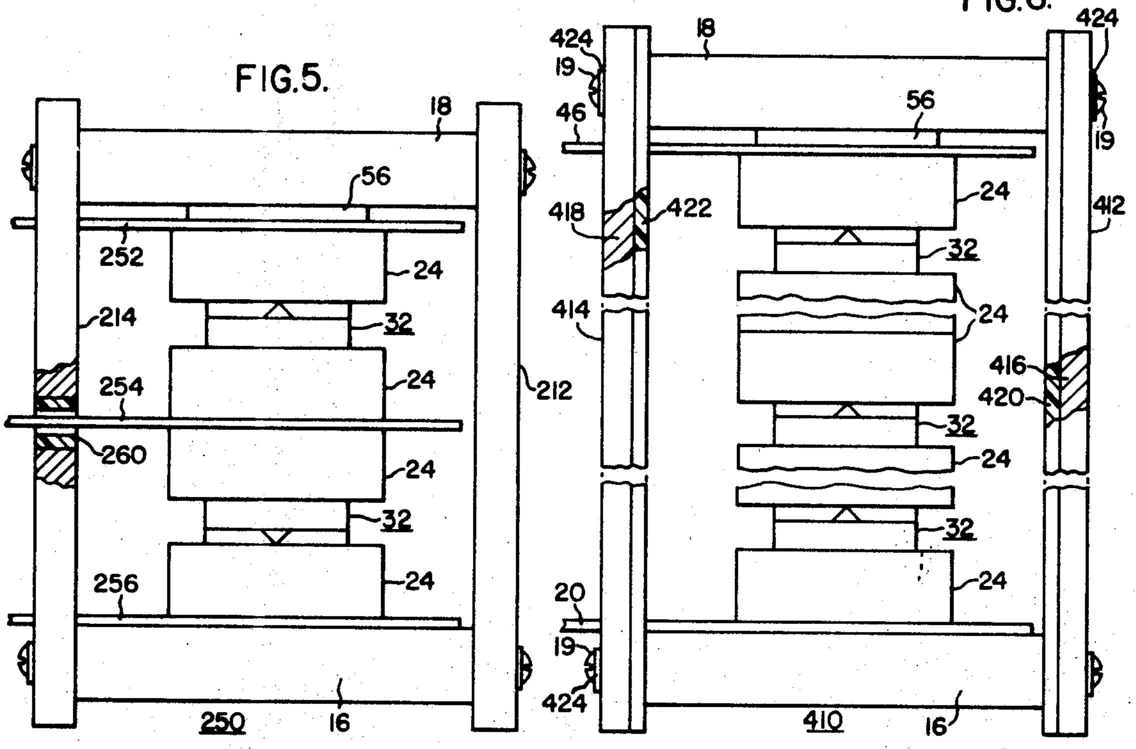
FIG. 5 is a simplified elevation view of a stacking module made in accordance with the teachings of this invention.
FIG. 6 is a simplified elevation view, partly in cross-section, of a stacking module made in accordance with the teachings of this invention.

FIG. 5 shows a simplified representation of the module 210 modified to function as an AC switch 250 comprising two semiconductor devices 32 and associated heat sink members 24. Three electrodes 252, 254 and 256 provide the required electrical contacts to the switch 250. The two devices 32 being electrically connected in an AC switch arrangement make the ends 16 and 18 of the switch 250 to be at the same electrical potential. Therefore, no electrical insulation is required between the ends 16 and 18, and the side members 212 and 214. However, it is desirable to have enough clearance between electrode 254 and the member 214 to prevent an accidental short circuit. Preferably a sleeve 260 of electrically insulating material is disposed within the clearance hole of the member 214 and about the electrode 254.

With reference to FIG. 6, there is shown a stacking module 410, comprising laminated side members 412 and 414.

The side members 412 and 414 each consist of respective metal members 416 and 418 and respective electrically insulated members 420 and 422. The metal members 416 and 418 comprise the same materials as the members 212 and 214 of the module 210. The members 420 and 422 comprise any suitable electrically insulating materials which fulfill the operating conditions of the module 410 and suitably bonded to the members 416 and 418 respectively. Most often the members 420 and 422 comprise a melamine or phenolic impregnated fibers, paper or fiberglass, suitably bonded to the respective members 416 and 418 by an appropriate adhesive. Additionally, the members 420 and 422 may comprise a suitable electrical insulation material.

It is to be noted that the bearing members—not shown here but item 17 in FIG. 1—must either comprise an electrical insulating material or must be electrically insulated from either the end plates 16 and 18 and the side members 412 and 414, or both. This may be accomplsihed by passing the bearing members through a clearance hole in either member 412 and 414 having its inner periphery lined with electrical insulating material. In a like manner the screws 19 must not be a means of electrical conduction between the end plates 16 and 18 and the side members 412 and 414. Additionally, if an electrically insulated lined clearance hole is employed an electrical insulator washer 424 must be inserted under the head of each metal screw 19.

Figure 7:
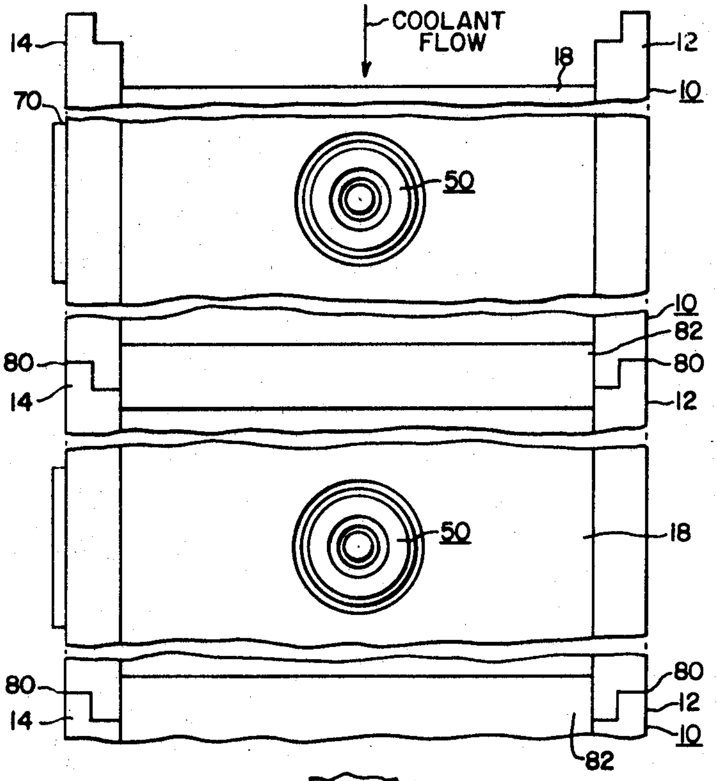
FIG. 7 is a top view of several stacking modules joined together in accordance with the teachings of this invention.

Referring now to FIG. 7 there is shown three stacking modules, for illustrative purposes only, stacking modules 10, joined together in a manner whereby the coolant medium flows through the modules 10 in a series flow. Each of the members 12 and 14 is fabricated in a manner that adjacent modules 10 may be joined together with a lap joint 80 to minimize the leakage of the coolant medium from the modules 10. Preferably the modules are joined together by suitable means which employ, for example, an adhesive disposed in the lap joint 80. Insulating machine screws such, for example, as made from nylon is also suitable. A gasket-like material is also suitable if it is desirable to effect a fluid tight seal.

The adjacent modules 10 most usually are not at the same electrical potential. Therefore the end plates 16 and 18 of each module 10 preferably do not extend the full width of the members 12 and 14. A gap is therefore present between adjacent modules joined together. Into this gap is fitted a strip 82 of electrically insulating material, the same as, or equivalent to, the material comprising the members 12 and 14, Additionally, when the side panels 12 and 14 comprise a metal, it is necessary that a strip of electrically insulating material be inserted in the lap joint between side members of adjacent modules.

In addition to passing a coolant medium through each module 10, a second coolant may be passed about the outside of the module 10. Preferably the two coolants are the same, such, for example, as oil, but they need not be if a tight seal is employed between modules in physical series array Referring now to FIG. 8 there is shown an alternate arrangement of a plurality of stack modules 10. In this instance a plurality of modules 10 are placed in two parallel assemblies 500 and 510. An entrance duct 512 is designed to split the coolant medium into two parts and channels the respective parts into the two parallel assemblies 500 and 510. Dummy module units 514 are constructed and placed between adjacent modules 10. Each dummy unit provides a ducted flow of the coolant from one module 10 to the next adjacent module 10. At the same time all required electrical circuitry and electronic components for adjacent modules 10 may be installed within these dummy units particularly when cooling of such components is desirable. Additionally, a plurality of baffles 516 is built into each dummy unit 514. The baffles 516 may comprise the same material, and function in the same manner as, the baffle rods 65 of each module 10. The dummy unit 514 provides a means for thoroughly mixing the coolant which passes from one module 10 prior to its entrance into the next adjacent module 10 thereby achieving a better cooling efficiency for the coolant medium as a remover of heat generated by the semiconductor devices and thermal dissipating members of each module 10.

Figure 8:
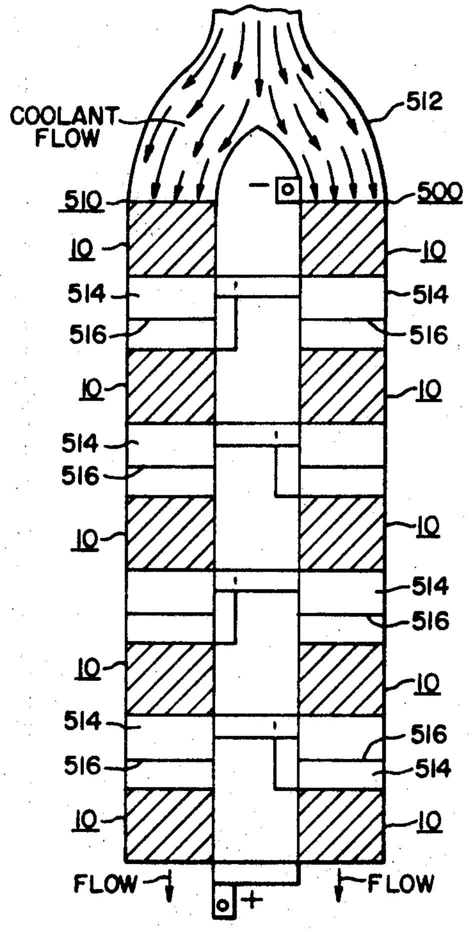
FIG. 8 is a schematic arrangement of a hypothetical use of stacking modules made in accordance with the teachings of this invention.

FIG. 8 shows all the modules 10 electrically connected together in a series electrical circuit relationship. The modules 10 however may, by employing suitable means to be connected together in a parallel electrical circuit relationship or a series-parallel electrical circuit relationship.

While the invention has been described with reference to particular embodiments and examples, it will be understood of course, that modifications, substitutes, and the like may be made therein without departing from its scope.

We claim as our invention:

1. An electrical apparatus consisting of at least one stacking module comprising:

(1) two opposed end plates;

(2) two side members, said members maintaining the opposed end plates apart from each other, said members and said end plates forming an enclosed passageway;

(3) a plurality of flat package electrical devices disposed as an aligned stack within said enclosed passageway whereby the passage of a cooling medium through the passageway cools the stacked devices;

(4) at least one thermally and electrically conductive member disposed between each end plate and one of said electrical devices and between each pair of adjacent electrical devices;

(5) at least two electrodes, one of said electrodes being disposed between one end plate and the adjacent thermally and electrically conductive member, another of said electrodes being disposed between the other end plate and the adjacent thermally and electrically conductive member, one end of each of said electrodes passing through and extending beyond one side member;

(6) means for axially aligning the electrical devices, the thermally and electrically conductive members, and the electrodes within the module;

(7) an axially disposed, readily adjustable force means disposed in at least one of the opposed end plates and acting directly on the electrical devices, the thermally and electrically conductive members, and the electrodes thereby forcing said devices, said members, and said electrodes into a good thermal and electrical conductive relationship with each other whereby a pressure electrical contact is established therebetween;

(8) at least one terminal board contiguous with one side member, said terminal board having an electrical circuit disposed thereon and electrically connected to at least one of said plurality of electrical devices.

2. The electrical apparatus of claim 1 in which the terminal board is an integral part of one of the side members.

3. The electrical apparatus of claim 1 in which the electrical potential of the readily adjustable force means is approximately the same electrical potential as the nearest electrical device.

4. The electrical apparatus of claim 3 wherein only two flat package electrical devices are disposed between the opposed end plates and including:

a third electrode disposed between, and in an electrically conductive relationship with, each of said electrical devices; and means for electrically connecting together said electrical devices to form an electrical circuit whereby said stacking module functions as an AC switch.

5. The electrical apparatus of claim 3 and including: each of said side members having a laminated construction, said laminated construction comprising at least one metal member and one electrically insulating member affixed together, said electrically insulating member of each of said side members being oriented so as to be disposed between one end of each end plate and the metal member, said electrical insulating member electrically insulating said end plates from said side members.

6. The electrical apparatus of claim 5 in which said metal member consists of a material selected from the group consisting of steel, stainless steel and aluminum.

7. The electrical apparatus of claim 3 wherein said module comprises at least two flat package electrical devices and including:

a third and a fourth electrode disposed between, and in an electrically conductive relationship with only one of two of said electrical devices;

an electrically insulating member disposed between said third and said fourth electrodes;

a portion of the means of axially aligning the electrical devices, the thermally and electrically conductive members, and the electrodes within the module consisting of a locating pin comprising an electrically insulating material, said pin extending entirely through said third electrode, said fourth electrode, said electrically insulating washer disposed therebetween, and projecting at least partway into the next adjacent components of the module having a contiguous surface with one of said third and said fourth electrodes; and means for connecting said electrical devices into a parallel electrical circuit.

8. The electrical apparatus of claim 7 wherein:

at least two flat package electrical devices are disposed between one of said third and said fourth electrodes and said corresponding end plate of said modules, said electrical devices being in a series electrical circuit relationship with each other.

9. The electrical apparatus of claim 1 wherein:

said electrical devices, said electrically and thermally conductive members, and said electrodes are electrically insulated from said end plates;

said side members each comprise a metal materials; and said side members are at approximately the same electrical potential as one of the electrical devices disposed closest to an end plate.

10. The electrical apparatus of claim 9 except that said side members are at approximately the same electrical potential as the electrical device disposed midway between the end plates.

11. The electrical apparatus of claim 1 in which:

the terminal board is mounted on the side panel by at least one fastening member which transverses the entire width of said module, said member lying in approximately the same plane as the central portion of an electrical device.

12. The electrical apparatus of claim 1 in which at least one baffle rod is disposed across the width of said module in approximately the same plane as the coextensive surfaces of each two adjacent thermally and electrically conductive members.

13. The electrical apparatus of claim 1 in which at least one load bearing member extends through the side members and at least partway into the base plate attached therebetween.

14. The electrical apparatus of claim 1 in which a portion of the means for axially aligning the electrical devices comprises each thermally and electrically conductive member in physical contact with an electrical device having (1) at least one major surface in contact with said electrical device, said major surface having a centrally disposed upwardly extending pedestal portion, and (2) an enclosed depression disposed in said major surface about the outer periphery of said upwardly extending pedestal portion, said depression having an outer wall and an inner wall, said outer wall being substantially vertical and said inner wall having an upwardly inclined surface, said depression having a greater top width than a bottom width, said inclined surface forming at least a portion of the outer peripheral surface of said upwardly extending pedestal portion.

15. The electrical apparatus of claim 1 wherein:

a plurality of stacking modules are joined together at the edges of their respective side members to define a continuous enclosed passageway suitable for circulating a coolant medium therethrough.

16. The electrical apparatus of claim 15 including:

at least one dummy stacking module comprising two opposed end plates spaced apart from each other by two side members disposed between, and joined to each of, two of the stacking modules of the electrical apparatus.

17. The electrical apparatus of claim 16 including:

means disposed within each dummy stacking module to create turbulence with a cooling medium caused to flow within the continuous enclosed passageway.

References Cited

UNITED STATES PATENTS

| | | | |
|---|---|---|---|
| 2,909,714 | 10/1959 | Diebold | 317—234 |
| 3,064,179 | 11/1962 | Wagner | 317—234 |
| 3,226,466 | 12/1965 | Martin | 174—15 |
| 3,238,425 | 3/1966 | Geyer | 317—234 |
| 3,280,389 | 10/1966 | Martin | 317—234 |
| 3,436,603 | 4/1969 | Vogt | 317—100 |

LEWIS H. MYERS, Primary Examiner

G. P. TOLIN, Assistant Examiner

U.S. Cl. X.R.

317—234